METHOD OF MAKING A SEMICONDUCTOR DEVICE

Filed Aug. 17, 1967

INVENTORS
HISASHI TOKI
TAKASHI AGATSUMA

BY Craig & Antonelli
ATTORNEYS 3,479,736

METHOD OF MAKING A SEMICONDUCTOR DEVICE

Hisashi Toki and Takashi Agatsuma, Kodaira-shi, Japan, assignors to Hitachi, Ltd., Tokyo, Japan, a corporation of Japan Filed Aug. 17, 1967, Ser. No. 661,297
Claims priority, application Japan, Aug. 31, 1966, 41/56,902
Int. Cl. B01j *17/00;* H01l *5/00*
U.S. Cl. 29—577 12 Claims

ABSTRACT OF THE DISCLOSURE

A method of making a semiconductor device including a method of forming a large-area electrode for use in a high power transistor, diode, etc., said method including stages of firmly fixing a first electrode layer as of nickel to a predetermined position on the surface of a semiconductor substrate by sintering, forming a passivation film on said substrate surface including the surface of said first electrode layer at a relatively low temperature, etching away said passivation film placed on said first electrode layer, forming an auxiliary metal layer as of nickel on the exposed first electrode layer by plating and forming a second electrode layer of solder on said auxiliary metal layer by immersing the assembly thus obtained into fused solder.

Background of the invention

This invention relates to a method of making a semiconductor device and more particularly to a manufacturing method suitable for a power semiconductor element, said method including a method of forming an electrode and a method of surface passivation.

Generally, since a power rectifier or a power transistor requires a large current capacity, an electrode having a large area must be provided. Further, since said electrode has to be firmly fixed to a semiconductor and made in ohmic contact therewith, the metal material for the electrode is carfeully selected. Generally, metals such as nickel, gold, platinum, rhodium or the like are used as the electrode material when the substrate semiconductor is silicon. In this regard, nickel electrodes are preferred. In practice, a solder layer is generally adhered to a nickel layer and an extending lead is bonded to said solder layer.

In order to obtain a reliable semiconductor element, the semiconductor surface, especially the part where the junction is exposed, is always covered with passivation films. As said passivation films, $SiO_2$ produced thermally by planar techniques or the like is mainly used because of its stability. However, since said $SiO_2$ or the like is also used as a selective mask during any diffusion treatment and is subjected to several heat cycles, it includes imperfections and impurities. Thus the $SiO_2$ which is used as a selective mask is not sufficient for passivating the semiconductor surface stably and for obtaining a junction having a high breakdown voltage. Therefore, all of said thermally produced oxide films are removed from the semiconductor surface when the diffusion treatment is finished and then a silicon compound is thermally decomposed on the semiconductor surface at a relatively low temperature (a temperature at which the impurity previously introduced into the semiconductor substrate does not rediffuse, a temperature of 700° C.–800° C. is desirable) to form passivation films of $SiO_2$ or the like which include very few impurity atoms. (Sometimes the anode oxidation method or the evaporation method is used.) In order to obtain an excellent power semiconductor element wherein said latter oxide films secure the surface passivation effect and wherein a junction having a high breakdown voltage is obtained, the formation of the electrode and the passivation films which are performed at the finishing stage plays an important role.

However, the present inventors have discovered, by studying manufacturing methods including said electrode formation and the formation of the passivation films, that in a conventional method of sintering nickel to an exposed surface of a silicon substrate which has a thermally produced oxide film thereon except on said exposed surface, the reducing atmosphere in which the nickel is sintered (this is the atmosphere for preventing the oxidation of the nickel surface) adversely influences the oxide films and thereby effects the lowering of the breakdown voltage of the element. In another conventional method, according to which a metal layer is formed in advance on a silicon substrate and a passivation film consisting mainly of $SiO_2$ is formed on the substrate surface except on said metal layer by oxidation in an atmosphere including lead at a relatively low temperature (500°–600° C.), the oxidizing atmosphere oxidizes the surface of the metal layer and thus renders difficult the attachment of the electrode thereto.

Summary of the invention

An object of the present invention is to provide a method of making an excellent semiconductor device and more particularly to provide a method of making a reliable power semiconductor device.

A more concrete object of the invention is to form a passivation film on a semiconductor surface without exposing an electrode metal secured to the semiconductor surface to a strong oxidizing atmosphere or to secure an electrode metal on a semiconductor surface without exposing a passivation film to a strong reducing atmosphere.

According to an embodiment of the invention, a first electrode metal is firmly fixed in a reducing atmosphere to a semiconductor surface and said metal surface and said semiconductor surface are covered with an oxide film at a relatively low temperature. Then, said film on said metal surface is eliminated and a second electrode metal is provided to the metal surface part where said film is eliminated. According to another embodiment of the invention, said first and second metals are connected through an auxiliary metal. Thus, it has become possible to form a desired semiconductor device without exposing said first metal electrode to a harmful oxidizing atmosphere and without exposing said oxide film to a reducing atmosphere.

For a semiconductor substrate employed in the present invention, silicon is most suitable, but germanium, an intermetallic compound semiconductor or the like can be used according to the purpose. As an electrode metal, nickel, platinum, rhodium or the like generally employed in the field of semiconductor techniques can be used.

Description of the preferred embodiments

Figure 1:
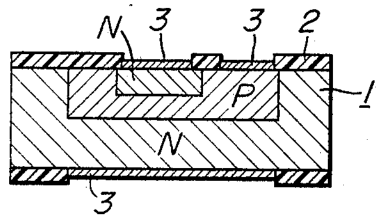
FIGS. 1 to 7 are sectional diagrams of a transistor at respective stages of the manufacturing process according to an embodiment of the invention.

FIG. 1 shows a semiconductor substrate 1 comprising a dish-shaped emitter (denoted by N) and a base region (denoted by P) formed by selectively introducing a conductivity type determining impurity into a silicon semiconductor substrate through a hole provided in an insulating film 2 such as silicon oxide or silicon nitride. The predetermined parts of the film 2 are eliminated so as to expose each region of the transistor. Then, thin layers of nickel 3 are provided to the exposed parts by electroless plating and are heat treated to 800° C. in a reducing atmosphere so as to firmly fix each of said nickel thin layers 3 to the semiconductor 1. Said heat treatment is performed at a temperature below the alloying temperature of silicon and nickel (above 900° C.), (this process is referred to as sintering in the following).

Figure 2:
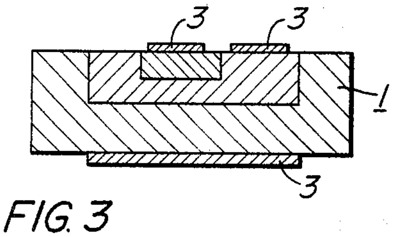
Figure 3:
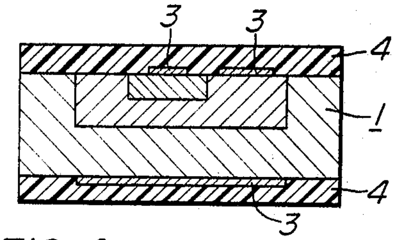

Then, as shown in FIG. 2 the remaining oxide films 2 are etched away from the semiconductor substrate 1 with a suitable echant. The assembly shown in FIG. 2 is placed in a reactor having a temperature below said sintering temperature and at which said impurity does not rediffuse (about 750° C.) and a low pressure (1 mm. Hg) and then new oxide films 4 having a thickness of about 5000–6000 A. are formed on all surfaces of the semiconductor substrate 1 including said nickel sintered part by introducing tetra ethoxysilane ($Si(C_2H_5O)_4$) and thermally decomposing the same.

Figure 4:
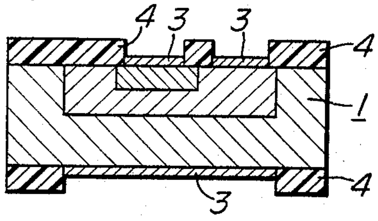
Figure 5:
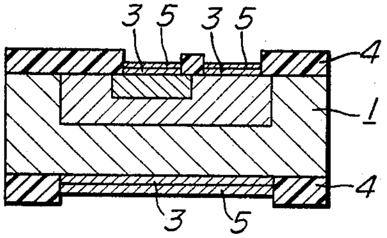
Figure 6:
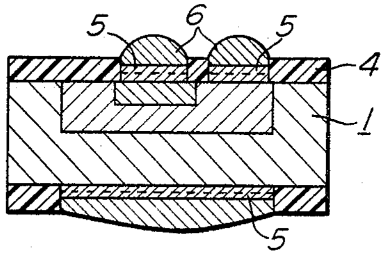
Figure 7:
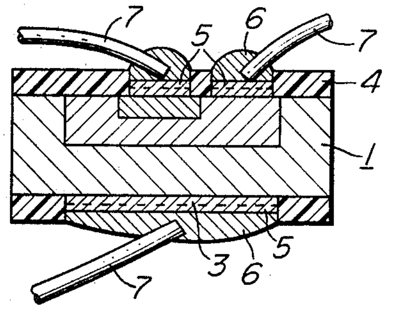

Then, the oxide films placed on said nickel sintered parts are selectively eliminated by any known photoetching technique as shown in FIG. 4. In this case, it is permissible to provide clean surfaces for a plating process to the surfaces of the nickel layers 3 subjected to the sintering treatment. Then, second nickel plated layers 5 are provided on said nickel sintered parts from which the oxide films are eliminated as shown in FIG. 5. Finally, said element is immersed into fused solder (about 340° C.) to adhere solder 6 onto the second nickel plated layer 5 and thus the assembly shown in FIG. 6 is obtained. FIG. 7 shows a semiconductor element wherein the attachment of the electrodes are completed by welding metal connectors 7 consisting of an arbitary material like nickel, Phosphor bronze, etc. to said solder layer 6.

According to another embodiment of the invention, the assembly shown in FIG. 4 is immediately dipped into fused solder to obtain the assembly shown in FIG. 6. Generally, it is difficult to solder the metal layer after the sintering treatment is done. However, since this is due to the fact that most metals soak into silicon during sintering, it is possible to adhere solder to the plated metal layers by making the plated layers thick in advance and sintering a small amount of them so as to leave some quantity of metal.

It is to be noted that the semiconductor surface may be sandblasted and made rough in order to facilitate sintering.

As is fully described hereinabove, since, according to an embodiment of the invetnion, oxide films and electrode layers are kept away from the harmful atmosphere (oxidizing or reducing atmosphere) when manufacturing by introducing new oxide films which include very few impurities instead of conventional oxide films which include greater amounts of impurities, the lowering of the breakdown voltage of the junction part of the semiconductor does not occur and, moreover, the electrode layers are prevented from oxidation and the attachment of electrodes becomes easier.

Now, the composition of an electrode of a transistor with solder helps to improve a large current characteristic of the transistor and is suitable for mass production. In particular, it has an advantage in that Cu or Al having a thermal expansion coefficient different from that of silicon which is a substrate semiconductor can be directly welded. Conventional transistors wherein the electrode is formed of solder are limited to those having a mesa structure and comprising no oxide films. However, according to the present invention, said technique can be applied to a planar-type or mesa-type transistor or a diode, and it has become feasible to fabricate a transistor comprising a solder electrode which has a high breakdown voltage and whose surfaces are passivated with oxide films.

As to the formation of passivation films, it is possible to use other organo-oxysilanes (e.g. ethyltriethoxysilane, phenyltriethoxysilane, vinyltriethoxysilane, etc.) which can be thermally decomposed at a relatively low temperature. Further, instead of the $SiO_2$ films explained in said embodiment, other passivation films may be used. For example, lead may be vacuum evaporated on the previously formed $SiO_2$ and the film may then be heat treated for a short time at 350° C. to 650° C. for vitrification. In addition, phosphorous boron or the like may be added to $SiO_2$ instead of lead. Further, instead of $SiO_2$ films, insulators like silicon nitride may be used.

We claim:

1. In a method of making a semiconductor device the improvement comprising the steps of:
- (a) applying a conductive layer to a predetermined portion of a surface of a semiconductor substrate through a hole formed in a mask layer applied on said surface;
- (b) firmly fixing said conductive layer to the predetermined portion of the surface of said semiconductor substrate by heating the substrate with said conductive layer in a non-oxidizing atmosphere;
- (c) removing said mask layer entirely from said surface of said substrate;
- (d) covering said surface of said semiconductor including the surface of said conductive layer with an insulating layer; and
- (e) providing a hole through said insulating layer so as to expose at least a part of said conductive layer.

2. A method according to claim 1, further comprising the step of providing another conductive layer on said exposed surface of the conductive layer.

3. A method according to claim 1, wherein said substrate is formed of silicon, said conductive layer is formed of nickel and said substrate is heat treated at a temperature below the alloying temperature of silicon and nickel.

4. A method according to claim 3, further comprising the step of depositing solder on said nickel layer.

5. A method according to claim 3, further comprising the steps of: depositing another nickel layer on the nickel layer directly fixed to said substrate; and depositing a solder layer on the former nickel layer.

6. A method according to claim 3, wherein said insulating layer is formed at a temperature below the temperature of said heat treatment.

7. A method according to claim 6, wherein said insulating layer is formed of silicon oxide provided by thermal decomposition of organo-oxysilane.

8. A method of making a semiconductor device comprising the steps of:
- (a) selectively introducing a conductivtiy type determining impurity into a semiconductor substrate through a hole provided in a film of an insulating material formed on a surface of said semiconductor substrate;
- (b) exposing a predetermined portion of said surface of said substrate while leaving other portions of said surface covered with said film formed of an insulating material;
- (c) depositing a metal layer on said exposed portion of said surface;
- (d) heat treating said substrate thus provided in reduction atmosphere at a temperature below the alloying temperature of said semiconductor and said metal;
- (e) eliminating all of said film formed of an insulating material from said surface;
- (f) depositing an insulating passivation film on the surface of said semiconductor substrate including the surface of said metal layer at a temperature below the temperature of said heat treatment; and
- (g) exposing at least one part of said metal layer by selectively eliminating said passivation film.

9. A method according to claim 8, wherein said semiconductor is formed of silicon and wherein said metal layer consists essentially of nickel.

10. A method according to claim 9, further comprising the steps of: depositing another nickel layer on the nickel layer not covered with said passivation film; and depositing solder on said another nickel layer by dipping said substrate thus provided into fused solder.

11. A method according to claim 9, further comprising the steps of: depositing a second layer of nickel on the nickel layer not covered with said passivation film; and depositing solder on said second nickel layer.

12. A method for manufacturing semiconductor devices, comprising the steps of:
(a) applying a conductive layer to a predetermined portion of a surface of a silicon semiconductor substrate through a hole formed in an insulating film of a silicon compound covering said surface;
(b) heating the combination thus composed in a non-oxidizing atmosphere to filmly fix the conductive layer to the predetermined portion of the surface of said silicon substrate;
(c) removing said insulating film entirely from said surface of said substrate;
(d) covering the surface of the combination thus composed except for at least one portion of said conductive layer with an insulating film including a substance selected from the group consisting of silicon oxide, silicon nitride and oxides of lead, boron and phosphorous; and
(e) connecting another conductive layer to the exposed portion of said conductive layer.

References Cited

UNITED STATES PATENTS

| | | | |
|---|---|---|---|
| 2,793,420 | 5/1957 | Johnston et al. | 29—590 |
| 2,981,877 | 4/1961 | Noyce. | |
| 3,169,892 | 2/1965 | Lemelson | 29—626 X |
| 3,237,271 | 3/1966 | Arnold et al. | 29—578 |
| 3,319,311 | 5/1967 | Mutter | 29—578 |
| 3,328,216 | 6/1967 | Brown et al. | 29—578 X |
| 3,362,851 | 1/1968 | Dunster | 29—590 X |
| 3,366,519 | 1/1968 | Pritchard et al. | 29—625 X |

PAUL M. COHEN, Primary Examiner

U.S. Cl. X.R.

29—472.9, 589, 625; 117—212, 217